(12) United States Patent
Osugi et al.

(10) Patent No.: US 8,480,911 B1
(45) Date of Patent: Jul. 9, 2013

(54) METHOD AND SYSTEM FOR PROVIDING A READ SENSOR IN A MAGNETIC RECORDING TRANSDUCER USING FOCUSED ION BEAM SCAN POLISHING

(75) Inventors: Masahiro Osugi, Fremont, CA (US); Guanghong Luo, Fremont, CA (US); Lily Yao, Hayward, CA (US); Ming Jiang, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 190 days.

(21) Appl. No.: 13/173,846

(22) Filed: Jun. 30, 2011

(51) Int. Cl.
*B44C 1/22* (2006.01)

(52) U.S. Cl.
USPC ............... 216/22; 216/62; 216/75; 360/313; 438/720

(58) Field of Classification Search
USPC ........ 216/22, 40, 58, 62, 66, 67, 75; 438/708, 438/717, 720; 360/313, 324.12
See application file for complete search history.

(56) References Cited

U.S. PATENT DOCUMENTS

| | | | |
|---|---|---|---|
| 4,025,411 A | 5/1977 | Hom-Ma et al. | |
| 4,671,970 A | 6/1987 | Keiser et al. | |
| 4,867,838 A | 9/1989 | Brooks et al. | |
| 6,387,810 B2 | 5/2002 | Beardsley et al. | |
| 6,440,638 B2 | 8/2002 | Golz et al. | |
| 6,586,162 B2 | 7/2003 | Lee | |
| 6,803,316 B2 | 10/2004 | Hudson et al. | |
| 2007/0217077 A1* | 9/2007 | Kanaya et al. | 360/313 |
| 2008/0317969 A1* | 12/2008 | Sasaki et al. | 427/523 |
| 2011/0127234 A1* | 6/2011 | Watanabe et al. | 216/22 |
| 2012/0156390 A1* | 6/2012 | Araki et al. | 427/534 |

\* cited by examiner

*Primary Examiner* — Lan Vinh

(57) ABSTRACT

A read sensor for a read transducer is fabricated. The read transducer has field and device regions. A read sensor stack is deposited. A mask covering part of the stack corresponding to the read sensor is provided. The read sensor having inboard and outboard junction angles is defined from the stack in a track width direction. A critical junction (CJ) focused ion beam scan (FIBS) polishing that removes part of the read sensor based on the junction angles is performed. A hard bias structure is deposited and the transducer planarized. A remaining portion of the mask is removed. A stripe height mask covering part of the read sensor and hard bias structure in a stripe height direction is provided. The read sensor stripe height is defined. A tunneling magnetoresistance (TMR) FIBS polishing that removes part of the stack in the field region is performed. An insulating layer is provided.

13 Claims, 16 Drawing Sheets

METHOD AND SYSTEM FOR PROVIDING A READ SENSOR IN A MAGNETIC RECORDING TRANSDUCER USING FOCUSED ION BEAM SCAN POLISHING

BACKGROUND

FIG. 1 depicts a conventional method 10 for fabricating a magnetoresistive sensor in magnetic recording technology applications. The method 10 typically commences after a conventional magnetoresistive or tunneling magnetoresistive (TMR) stack has been deposited. The conventional read sensor stack typically includes an antiferromagnetic (AFM) layer, a pinned layer, a nonmagnetic spacer layer, and a free layer. In addition, seed and/or capping layers may be used. The conventional magnetoresistive stack resides on an underlayer, which may be a substrate.

The conventional method 10 commences by providing a conventional hard mask layer and a photoresist mask, via step 12. The conventional hard mask layer is typically a material such as SiC or diamond-like carbon (DLC). The conventional photoresist mask has the desired pattern, which is transferred to the conventional hard mask layer. The conventional photoresist mask covers the region from which the conventional magnetoresistive sensor is to be formed, as well as a portion of the transducer distal from the sensor. However, part of the device region adjoining the magnetoresistive sensor is left uncovered.

A conventional hard mask is defined from the conventional hard mask layer, via step 14. Step 14 includes transferring the pattern from the conventional photoresist mask, for example through a reactive ion etch (RIE). The photoresist mask may also be removed in step 14.

The magnetoresistive structure is defined, via step 16. Step 16 typically includes ion milling the transducer. Thus, the exposed portion of the magnetoresistive stack is removed. The magnetoresistive structure being defined may be a magnetoresistive sensor for a read transducer.

The hard bias material(s), such as CoPt, are deposited, via step 18. In addition, seed and/or capping layers may be provided in step 18. The hard bias material(s) and other layers are deposited while the conventional hard mask is in place. In addition, a shallow mill may be performed as part of providing the hard bias structure. A capping layer may be deposited after the shallow ion mill is completed. The capping layer typically includes a noble metal such as Ru, Ta, and/or Rh.

A chemical mechanical planarization (CMP) is performed, via step 20. This CMP aids in removing the hard bias materials above the hard mask and planarizes the top surface of the transducer. The hard mask may then be removed, for example via a reactive ion etch (RIE), via step 22. An additional planarization is performed, via step 24. The stripe height of the sensor is then defined, via step 26. Note that in some instances, the stripe height may be defined in step 26 prior to the steps 12-24 used at least in part to define the magnetoresistive sensor. An insulator such as aluminum oxide is deposited on the transducer, via step 28.

FIG. 2 depicts an ABS view of a conventional transducer 50 fabricated using the conventional method 10. For clarity, FIG. 2 is not to scale. A TMR sensor 54 residing on a substrate 52 is shown. Also shown are hard bias 56 and 58. The TMR junction 54 has inboard and outboard junction angles, $\alpha$ and $\beta$. The inboard junction angle, $\alpha$, is closer to the center of the substrate on which the junction 54 is fabricated than the outboard junction angle $\beta$. Also shown is insulator 60 and 62 provided in step 28.

Although the conventional method 10 allows the conventional transducer 50 to be fabricated, there are several drawbacks. The conventional method 10 still results in within wafer variations that are greater than desired. For example, the onboard junction angle, $\alpha$, is typically different from the outboard junction angle, $\beta$. This difference may be greater than the desired $\alpha$. Further, portions of the read sensor stack may be left in the field regions after the read sensor is defined in the stripe height and track width directions. There may also be variations in the height of the hard bias structure above the conventional TMR sensor 54. The insulator 60 and 62 provided on the transducer 50 in step 28 may have a height that varies to a greater degree than desired. It may also be typically difficult to control the CMPs performed in steps 20 and 24. Thus, some portion of the hard bias materials 56 and 58 may be depleted of certain constituents, such as Co. Further, the slurry used for the CMPs performed in steps 20 and 24 may result in corrosion of underlying metal layers, particularly Co depleted hard bias materials 56 and 58. Thus, fabrication of the conventional read transducer 50 is desired to be improved.

Accordingly, what is needed is a system and method for improving the fabrication of a magnetic recording read transducer.

BRIEF SUMMARY OF THE INVENTION

A read sensor is fabricated on a substrate for a read transducer. The read transducer has a field region and a device region in which the read sensor resides. A read sensor stack including a plurality of layers is deposited on the substrate. A mask is provided on the read sensor stack. The mask has a pattern that covers a first portion of the read sensor stack corresponding to the read sensor, covers a second portion of the read sensor stack distal from the read sensor, and exposes a third portion of the read sensor stack between the first portion and the second portion of the read sensor stack. The read sensor is defined from the read sensor stack in a track width direction. Defining the read sensor includes substantially removing the third portion of the read sensor stack. The read sensor has an inboard junction angle and an outboard junction angle. A critical junction (CJ) focused ion beam scan (FIBS) polishing of the transducer is performed. The CJ FIBS polishing removes a portion of the read sensor based on the inboard junction angle and the outboard junction angle. A hard bias structure is deposited. The transducer is planarized. A remaining portion of the mask is removed. A stripe height mask covering a fourth portion of the read sensor and a portion of the hard bias structure in a stripe height direction is provided. The stripe height of the read sensor is defined from the read sensor stack. A tunneling magnetoresistance (TMR) FIBS polishing of the field region of the transducer is performed. The TMR FIBS polishing removes a remaining portion of the read sensor stack in the field region. An insulating layer for electrically insulating the read transducer is provided.

BRIEF DESCRIPTION OF SEVERAL VIEWS OF THE DRAWINGS

FIGS. 18A and 18B-25A and 25B depict ABS and apex views of the exemplary embodiment of the magnetic recording transducer during fabrication.

DETAILED DESCRIPTION OF THE PREFERRED EMBODIMENTS

Figure 1:
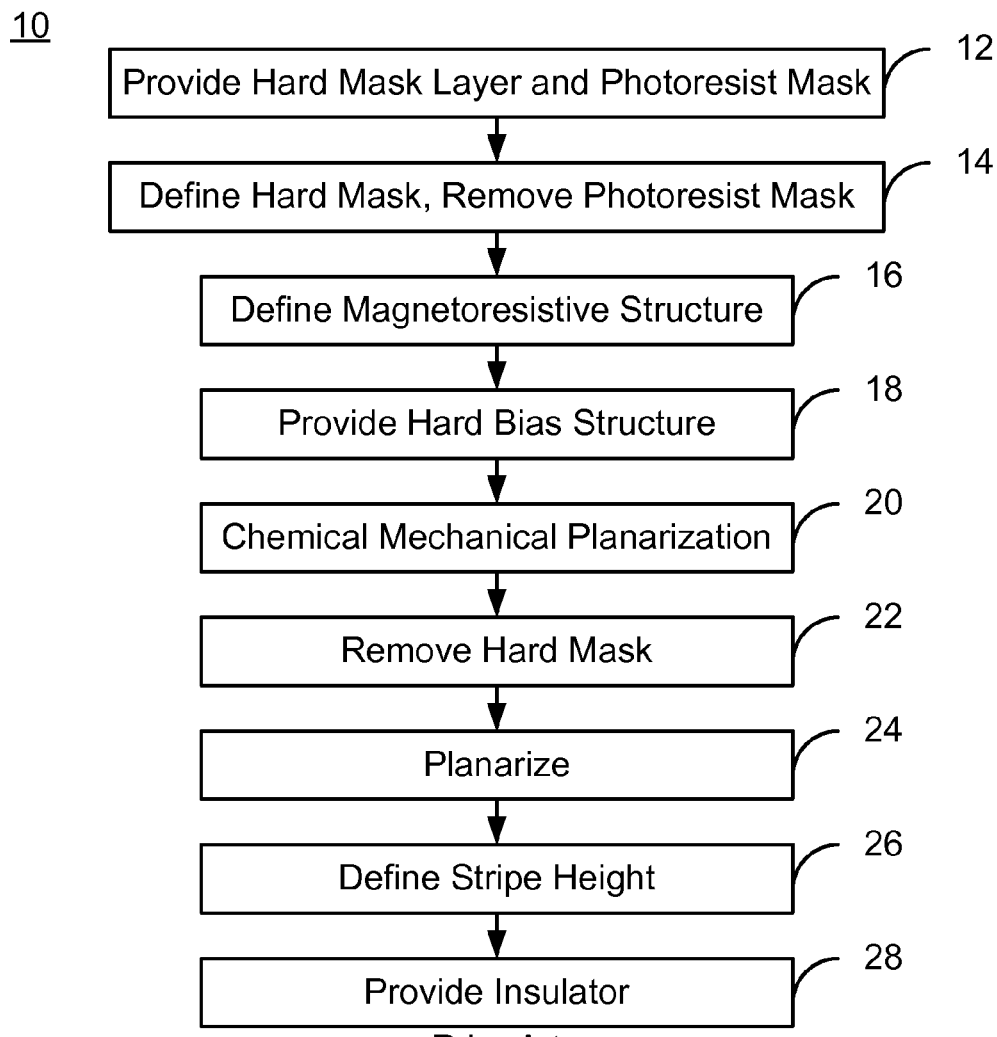
FIG. 1 is a flow chart depicting a conventional method for fabricating a read sensor for magnetic recording transducer.
Figure 2:
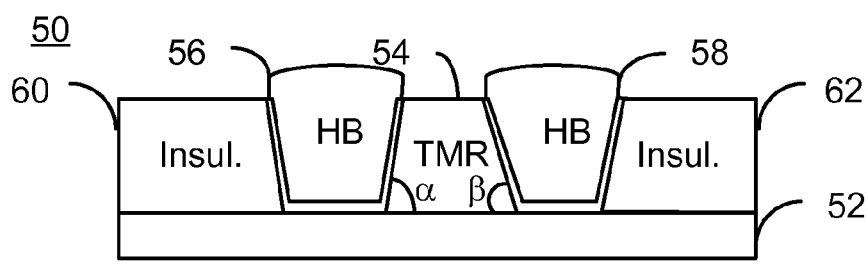
FIG. 2 depicts an ABS view of a conventional magnetic recording transducer.
Figure 3:
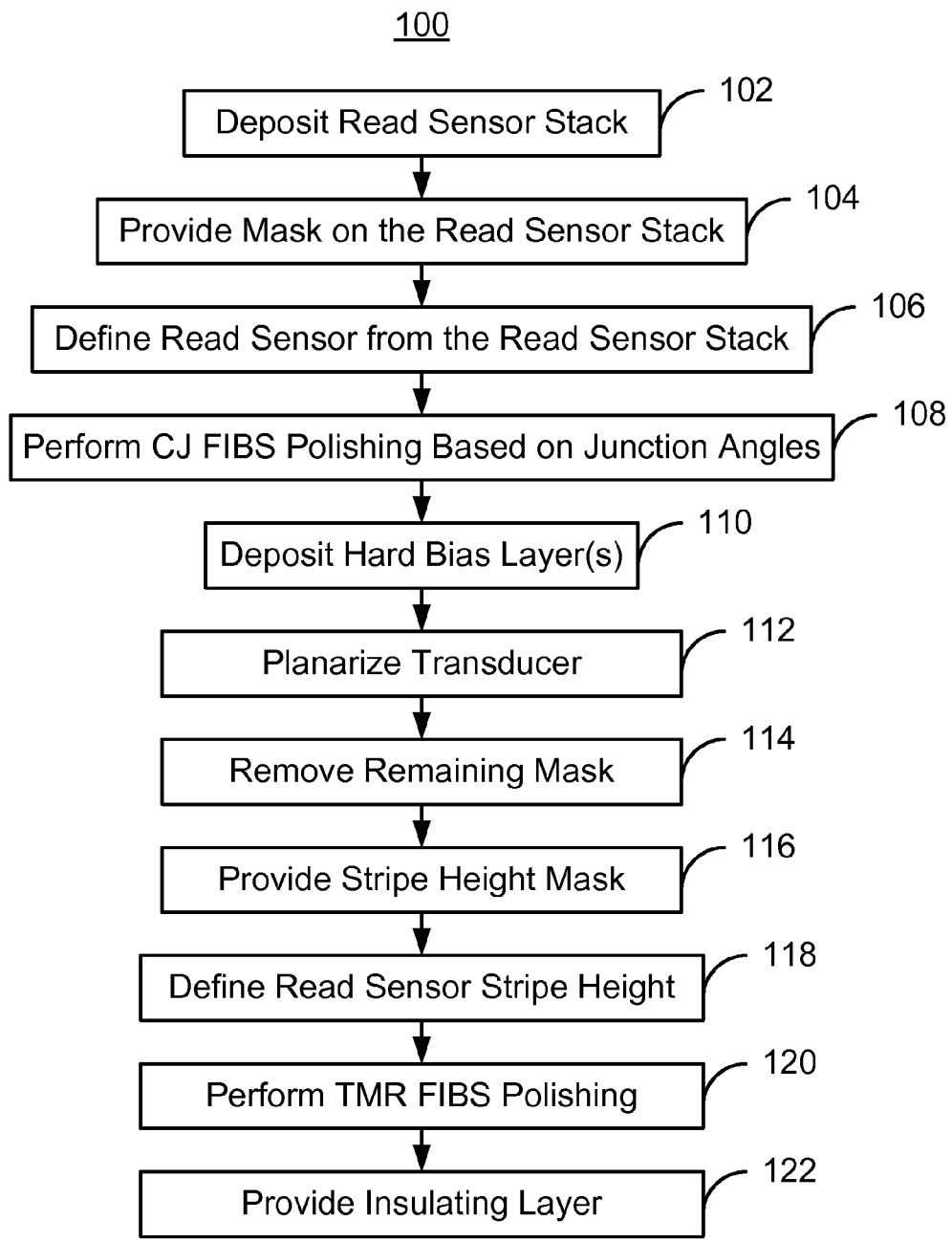
FIG. 3 depicts an exemplary embodiment of a method for fabricating a read sensor for a magnetic recording transducer.

FIG. 3 is an exemplary embodiment of a method 100 for providing magnetic recording transducer. For simplicity, some steps may be omitted. The method 100 is also described in the context of providing a single recording transducer. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer. For example, the method 100 may start after layers underlying the magnetoresistive sensor, such as a tunneling magnetoresistive (TMR) sensor have been fabricated.

A read sensor stack is deposited on the substrate, via step 102. The magnetoresistive layers may include a pinning layer, a pinned layer, a nonmagnetic spacer layer, and a free layer. In addition, seed and/or capping layers may be used. The pinning layer may be an AFM or other layer configured to fix, or pin, the magnetization of the pinned layer. The pinned layer may be a synthetic antiferromagnetic (SAF) layer including magnetically coupled ferromagnetic layers separated by a nonmagnetic layer. The ferromagnetic layers may be termed pinned and reference sub-layers. The nonmagnetic spacer layer may be a conductive layer for a giant magnetoresistive structure, an insulator for a TMR structure, or may have another structure. The free layer is ferromagnetic and has a magnetization that is free to change in response to an external magnetic field, for example from a media. The free layer may have multiple sub-layers, as may the pinned and reference sub-layers. Further, the transducer may be considered to have a device region, in which the magnetoresistive structure is to be formed, and a field region distal from the magnetoresistive structure.

A mask is provided on the read sensor stack, via step 104. The mask has a pattern that covers a first portion of the read sensor stack corresponding to the read sensor. A second portion of the read sensor stack distal from the read sensor is covered, while a third portion of the read sensor stack between the first portion and the second portion of the read sensor stack is exposed. In some embodiments, the mask is a hard mask. Step 104 may thus include depositing a hard mask layer, such as one or more of SiC and diamond-like carbon (DLC). A photoresist mask may then be provided on the hard mask layer. Pattern transfer and/or antireflective coating (ARC) layers may also be used. The pattern of the photoresist mask is then transferred to the hard mask layer, forming the mask.

The read sensor is defined from the read sensor stack in the track width direction, via step 106. The third, exposed portion of the read sensor stack is thus removed. Step 106 may include performing an ion mill. The read sensor may be a TMR junction, a GMR junction, or other sensor. The read sensor has junction angles at its base in the track width direction. The read sensor has an in board junction angle and an outboard junction angle.

A critical junction (CJ) focused ion beam scan (FIBS) polishing of the mask layer and the hard bias layer is performed, via step 108. The CJ FIBS polishing removes a portion of the read sensor based on the inboard junction angle and the outboard junction angle. The FIBS polishing scans across the desired portion of the substrate while a focused ion beam polishing is being performed. The amount of polishing may depend upon the size of the inboard and outboard angles, as well as the difference between the angles. In some embodiments, the step of CJ FIBS polishing the read sensor includes measuring the inboard and outboard junction angles across the substrate. In some embodiments, the step of measuring the junction angles may include performing the measurements for every wafer being processed. In other embodiments, the measurement may be performed for only some wafers. For example, one wafer per batch or other analogous set of wafers may be performed. In some embodiments, step 108 includes scanning across the substrate while ion polishing such that the ion polishing removes a greater amount of the read sensor for a smaller junction angle. In this way, the width of the sensor in the track width direction is reduced and made more symmetric around the desired central region of the sensor. In some embodiments, multiple passes, or scans, are performed for some or all of the substrate. In some embodiments, the ion polishing is performed for a longer time for the smaller angle sizes. The CJ FIBS polishing may be terminated based on end-point detection.

At least one hard bias layer for a hard bias structure is deposited, via step 110. Hard bias material(s) include those materials having a sufficiently high coercivity that normal operation of the magnetoresistive structure does not alter the magnetization (and thus the bias) of the hard bias materials. A portion of the hard bias material(s) is substantially adjacent to the magnetoresistive structure in the track width direction. If the magnetoresistive structure is to be used in a current-perpendicular-to-plane (CPP) configuration, then an insulating layer may be deposited prior to the hard bias materials. In addition, seed and/or capping layers may also be provided in step 110. The seed and/or capping layer(s) may each include sub-layers. For example, the capping layer may be a bilayer including a Ta sub-layer and a Ru sub-layer on the Ta sub-layer. In another embodiment, the capping layer(s) may be a trilayer including a Ru sub-layer sandwiched by two Ta sub-layers. A shallow ion mill may also be performed in step 110.

The transducer is planarized, via step 112. Thus, a portion of the hard bias structure as well as the mask is removed. In some embodiments, the planarization in step 112 is a CMP. In other embodiments, other mechanisms may be used to planarize the transducer. For example, a milling and etchback, including use of a FIBS polishing, may be performed.

A remaining portion of the mask is removed, via step 114. In some embodiments, step 114 includes performing a removal process, such as an RIE, appropriate for the hard mask.

A stripe height mask is provided, via step 116. The stripe height mask covers a desired portion of at least the read sensor in a stripe height direction. In embodiments in which the read sensor is first defined in the track width direction, both the read sensor and part of the hard bias structure are covered. In some embodiments, step 116 is performed by forming a photoresist mask.

The stripe height of the read sensor is defined from the read sensor stack, via step 118. Thus, portions of the read sensor further from the ABS than the stripe height mask back edge and in the exposed field regions are removed. In some embodiments, step 118 is performed by an ion mill. Step 118 is analogous to step 106. However, step 118 defines the read sensor in the stripe height direction perpendicular to the ABS, while step 106 defines the read sensor in the track width direction.

After step 118 is performed, some portion of the read sensor stack in the field regions may remain. Thus, a tunneling magnetoresistance (TMR) FIBS polishing of the field region of the transducer is performed, via step 120. The TMR FIBS polishing removes a remaining portion of the read sensor stack in the field regions. Step 120 is analogous to step 108. The TMR FIBS polishing is used to further shape the back edge of the read sensor and remove any remaining excess read sensor stack remaining in the field regions. Thus, the step height and/or the angle of the back edge of the read sensor is used. In some embodiments, the step height is defined as the difference between the top of the stripe height mask and the field. The TMR FIBS polishing may include measuring at least one of the step height and the back edge angle of the read sensor. In some embodiments, the step of measuring this step height and/or back edge angle may include performing the measurements for every wafer being processed. In other embodiments, the measurement may be performed for only some wafers. For example, one wafer per batch or other analogous set of wafers may be performed. In some embodiments, step 120 includes scanning across the substrate while ion polishing such that the ion polishing removes a greater amount of the read sensor stack in the field region for a smaller step height. A smaller step height for the read sensor indicates the presence of unwanted read sensor material in the field. The FIBS polishing removes this unwanted material and increases the step height. In addition, step 120 may include scanning across the substrate while ion polishing such that the ion polishing removes a greater amount of the read sensor for a smaller back edge angle. The TMR FIBS polishing thus removes a portion of the read sensor not covered by the mask, thereby increasing the back edge angle. In some embodiments, multiple passes, or scans, are performed for some or all of the substrate. In some embodiments, the ion polishing is performed for a longer time for the smaller angles and/or step height. The TMR FIBS polishing may be terminated based on end-point detection. Thus, the excess read sensor stack may be removed.

Note that in the method 100 depicted in FIG. 3, the read sensor is defined in the track width prior to being defined in the stripe height direction. In other embodiments, the read sensor might be defined in the stripe height direction first. In such embodiments, the steps 116, 118, and 120 may be performed before step 104-108.

An insulating layer for electrically insulating the read transducer is provided, via step 122. More specifically, the hard bias structure and TMR sensor may be insulated. Fabrication of the transducer may then be completed.

Figure 4:
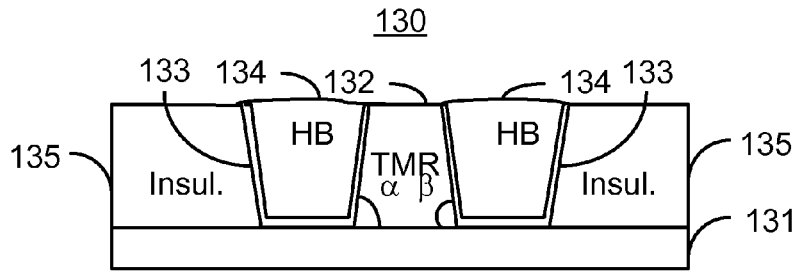
FIG. 4 depicts an ABS view of an exemplary embodiment of a magnetic recording read transducer.

FIG. 4 depicts the transducer 130 after the method 100 is completed. For clarity, FIG. 4 is not to scale. In addition, only a portion of the transducer 130 is shown. The transducer is also described in the context of particular layers and structures. However, sublayers and/or substructures may also be provided. The magnetoresistive sensor 132 and hard bias structures 134 are shown as residing on underlying layers 131. The regions 135 may insulator(s). Further, an insulator 133 may be provided to insulate the hard bias structure 134 from the read sensor 132. In other embodiments, the insulating layer 133 might be omitted.

Using the method 100, the transducer 130 having a magnetoresistive read sensor 132 may be formed. The CJ FIBS polishing step aids in ensuring that the junction angles $\alpha$ and $\beta$ are even and have a desired magnitude. Thus, uniformity of the sensor 132 is improved. The TMR FIBS polishing reduces variations in the field regions. Additional FIBS polishing steps might also be added to the method 100. For example, a hard mask FIBS polishing may be performed when the hard mask is deposited. Thus, variations in the hard mask may be reduced. Similarly, a notch FIBS polishing may be performed after the hard mask is removed. This FIBS polishing may reduce the height of the notch between the read sensor and hard bias structures. Such a FIBS polishing may improve the uniformity of the notch. Thus, the fabrication of the transducer may be improved.

Figure 5:
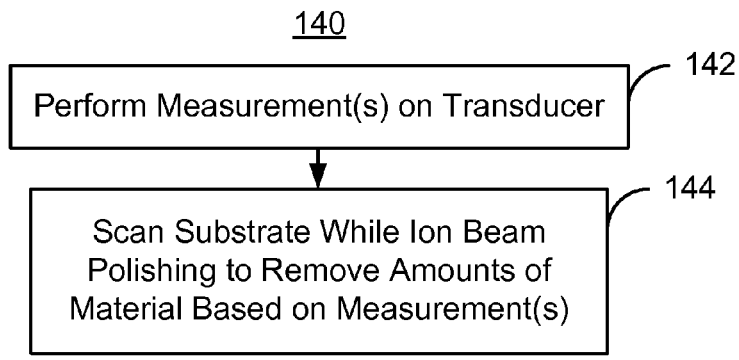
FIG. 5 is a flow chart depicting an exemplary embodiment of a method for performing a FIBS polishing.
Figure 6:
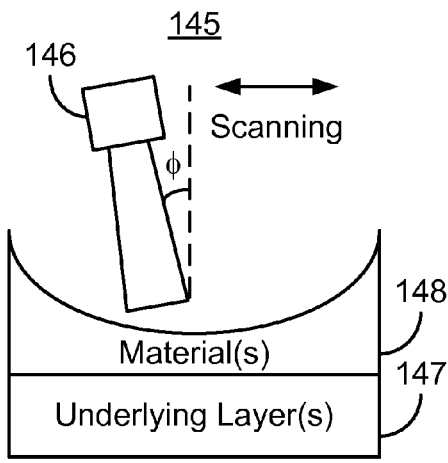
FIGS. 6 and 7 depict an exemplary embodiment of a magnetic recording transducer undergoing FIBS polishing.
Figure 7:
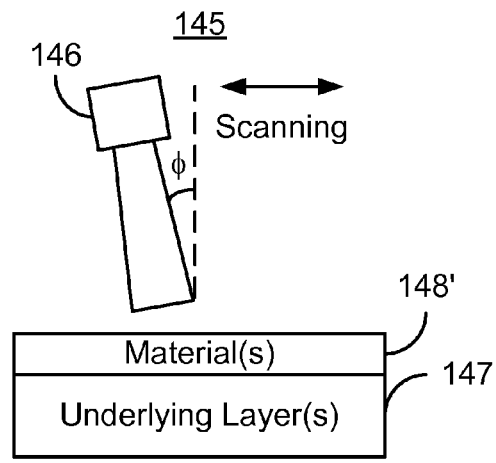

FIG. 5 is a flow chart depicting an exemplary embodiment of a method 140 for performing a FIBS polishing. FIGS. 6-7 depict another exemplary embodiment of a portion of a magnetic recording transducer 145 during fabrication. For clarity, FIGS. 6-7 are not to scale. The method 140 is described in the context of the transducer 145. For simplicity, some steps of the method 145 may be omitted. The method 140 is also described in the context of providing a single recording transducer 145. However, the method 140 may be used to fabricate multiple transducers at substantially the same time. The method 140 and transducer 145 are also described in the context of particular layers. A particular layer may include multiple materials and/or multiple sub-layers.

Measurements are performed on the transducer, via step 142. The measurements may be step heights, thicknesses, angles, or other measures of interest. The measurements may be made using profilometry or other mechanisms. The substrate is scanned while ion beam polishing to remove the desired material from the substrate based on the measurements, via step 144. Step 144 may include performing multiple scans over the entire substrate, performing multiple scans over portions of the substrate, and/or pausing to spend more time polishing desired regions.

FIGS. 6-7 depict the transducer 145 during step 144. The ion beam is tilted at a desired polishing angle, $\phi$, such that removal rate of all desired constituents is substantially equal. FIG. 6 depicts the variations in height. Thus, measurements of the thicknesses of the material(s) 148, the angles in the material(s) 148 or issues, and/or the height of the top surface of the material(s) 148 above the underlying layers 147 may be measured. In contrast, FIG. 7 depicts the transducer 145 after step 144 is completed for a region shown. Thus, the top surface of the material(s) 148' is thinned and substantially flat. Thus, the variations in material(s) 148 may be reduced by the FIBS polishing.

Figure 8:
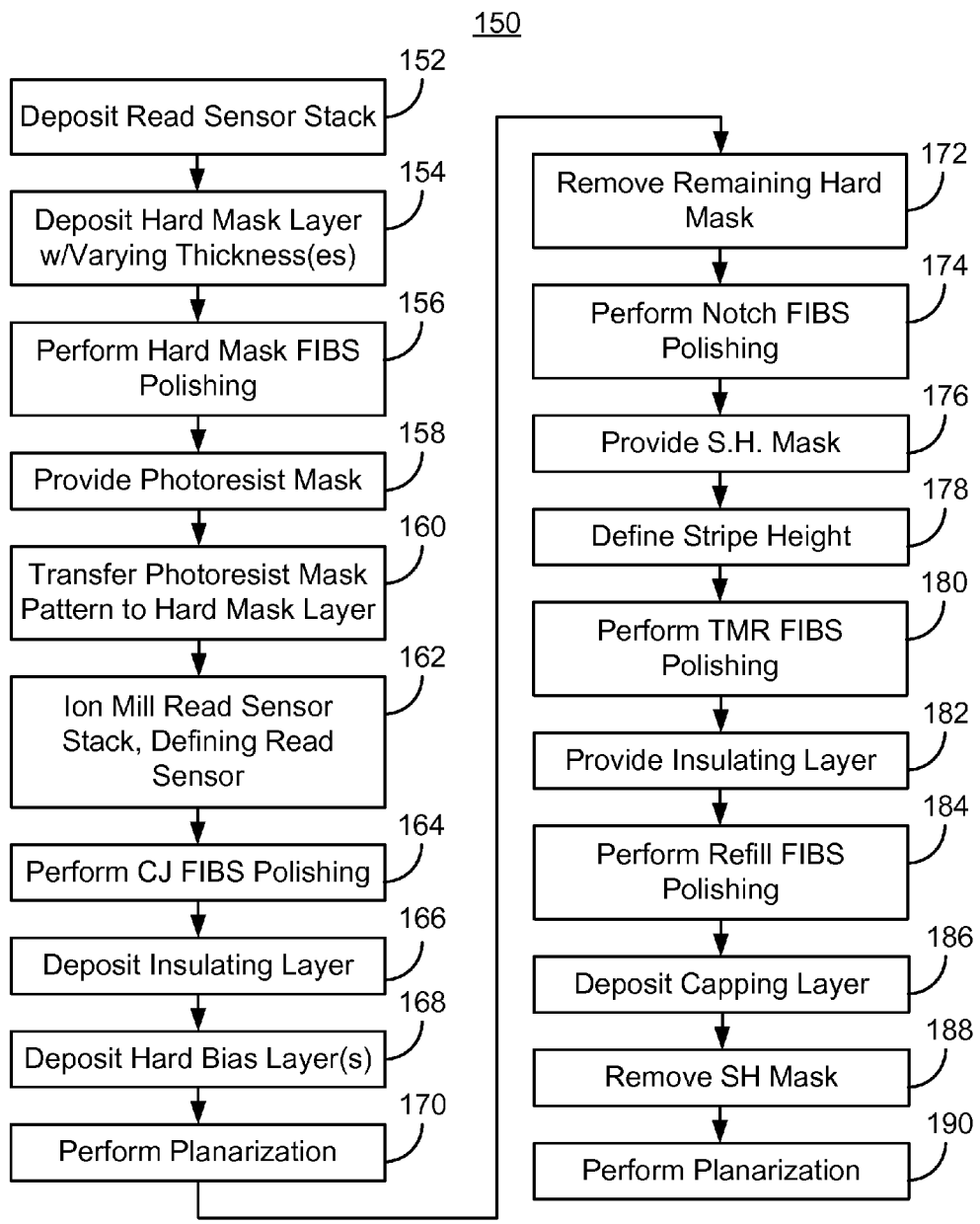
FIG. 8 is a flow chart depicting an exemplary embodiment of a method for fabricating a magnetic recording read transducer.

FIG. 8 is a flow chart depicting another exemplary embodiment of a method 150 for fabricating a magnetic recording transducer. FIGS. 9-26 depict ABS views of another exemplary embodiment of a magnetic recording transducer 200 during fabrication. For clarity, FIGS. 9-26 are not to scale. The method 150 is described in the context of the transducer 200. For simplicity, some steps of the method 150 may be omitted. The method 150 is also described in the context of providing a single recording transducer 200. However, the method 150 may be used to fabricate multiple transducers at substantially the same time. The method 150 and transducer 200 are also described in the context of particular layers. A particular layer may include multiple materials and/or multiple sub-layers. The method 150 also may start after formation of other portions of the magnetic recording transducer 200. Further, the transducer may be considered to have a device region, in which the magnetoresistive structure is to be formed, and a field region distal from the magnetoresistive structure.

A stack for the read sensor is deposited, via step 152. The magnetoresistive layers may include a pinning layer, a pinned layer, a nonmagnetic spacer layer, and a free layer. In addition, seed and/or capping layers may be used. Examples of such layers are described above.

A hard mask layer is provided on the read sensor stack, via step 154. Step 154 includes blanket depositing a hard mask layer such as SiC, amorphous carbon (e.g. sputtered carbon), and/or DLC on the read sensor stack. For the purposes of describing the method 150, it is assumed that an SiC layer is used. In some embodiments, the step 154 includes depositing a hard mask layer having a thickness of not more than seventy nanometers. In another embodiment, the hard mask layer provided in step 154 has a thickness of not more than sixty nanometers. However, in other embodiments, other thicknesses of the hard mask layer may be used.

Figure 9:
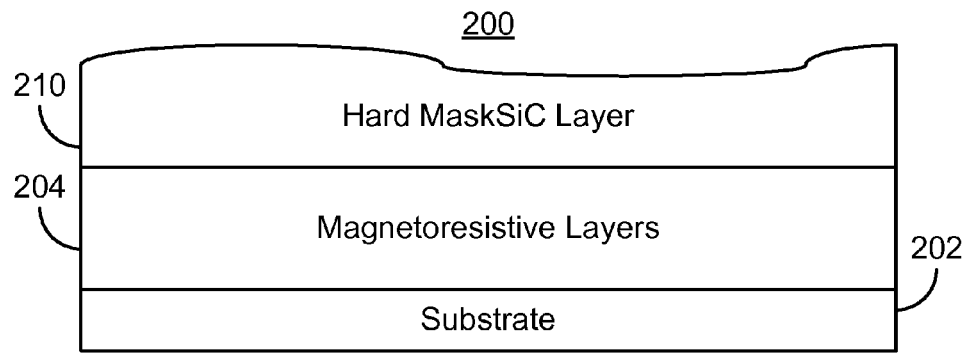
FIGS. 9-17 depict ABS views of an exemplary embodiment of a magnetic recording transducer during fabrication.

FIG. 9 depicts an ABS view of the transducer 200 after step 152 is performed. Thus, a substrate 202 and read sensor stack 204 are shown. The substrate 202 may include underlying layers such as shield or insulating gap layers. In addition, the hard mask layer 210 is shown as being blanket deposited on the read sensor stack 204. The thickness of the hard mask 210 varies across the substrate 202. However, a hard mask layer having a uniform thickness and height is desired.

Figure 10:
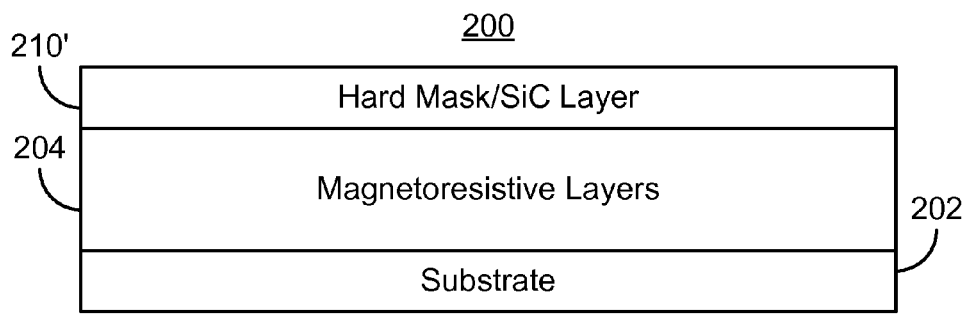

A hard mask FIBS polishing may thus be performed on the hard mask layer, via step 156. Step 156 may include measuring the thicknesses of the hard mask layer. The transducer is also scanned while ion beam polishing is performed based on the thickness measurement. A greater amount of hard mask layer is removed for a greater hard mask layer thickness. FIG. 10 depicts the transducer 200 after step 156 is performed. The hard mask layer 210' thus has a more uniform thickness.

A photoresist mask is provided, via step 158. The photoresist mask has a pattern that is desired to be transferred to the underling layers. Step 158 includes spinning on or otherwise covering at least the relevant areas of the transducer 200 with a layer of photoresist. Photolithography may then be used to form the desired pattern in the photoresist layer. The photoresist mask covers regions corresponding to the sensor portion and line frame.

Figure 11:
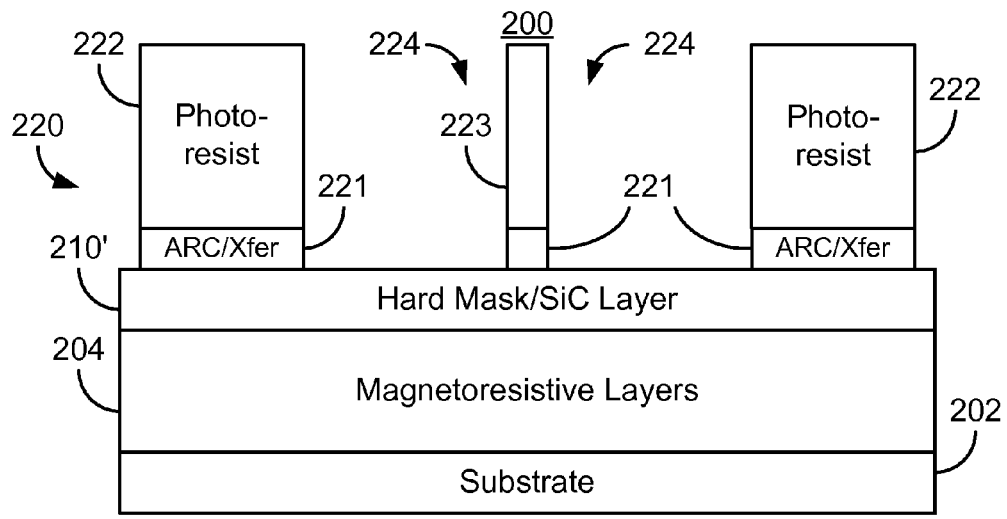

FIG. 11 depicts an ABS view of the transducer 200 after step 158 is performed. Thus, the mask 220 is shown. The mask 220 has ARC/transfer layers 221 and photoresist portions 222 and 223. The ARC/transfer layers 221 may include an antireflective coating (ARC) layer as well as a layer such as Cr used to aid in forming the mask 220 and transferring the pattern to the underlying layers. The portion 223 of the photoresist corresponds to the read sensor and may be printed with a critical dimension at the limit of the photo process used for the mask 220. However, the width of the frame 222 may be larger. The mask 220 also includes apertures 224 uncovering portions of the hard mask layer 210'.

Figure 12:
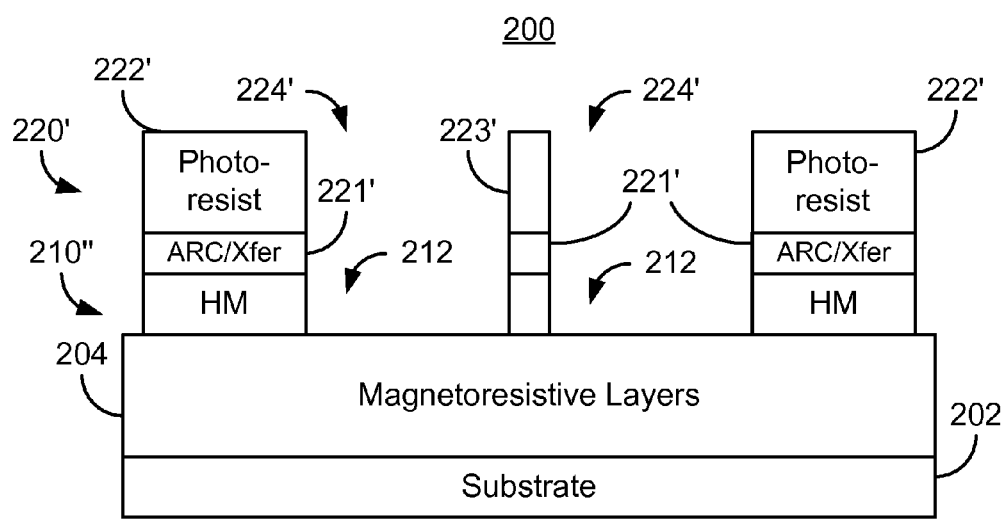

The pattern of the mask 220 is transferred to the hard mask layer 210', via step 160. In some embodiments, step 160 may include performing RIE(s) appropriate for the material(s) used for the hard mask layer 210'. For example, in some embodiments a SiC RIE might be used. In addition, the remaining photoresist 220' is stripped. FIG. 12 depicts the transducer 200 after the pattern has been transferred, but before the photoresist mask 220 has been stripped. Thus, the pattern of the photoresist mask 220' has been transferred to hard mask layer 210''. Thus, the hard mask layer 210'' has apertures 212 that expose a region of the read sensor stack 204 between the sensor region (covered by photoresist mask 223') and regions distal from the sensor (covered by photoresist mask 222'). It is expected that the dimensions of the portions 221', 222', and 224' of the mask 220' change during step 160.

The read sensor is defined from the read sensor stack using ion milling, via step 162. Thus, the third portion of the read sensor stack exposed by apertures 212 is removed. Thus, a magnetoresistive read sensor has been defined. However, in some embodiments, the junction angles γ and δ differ.

A CJ FIBS polishing is performed, via step 164. Step 164 is analogous to step 108 of the method 100. Thus, the inboard junction angle, γ, and the outboard junction angle, δ, are measured. Step 164 also includes scanning across the substrate while ion polishing such that the ion polishing removes a greater amount of read sensor for a smaller inboard junction angle and/or smaller outboard junction angle. The method 140 may thus be employed.

Figure 13:
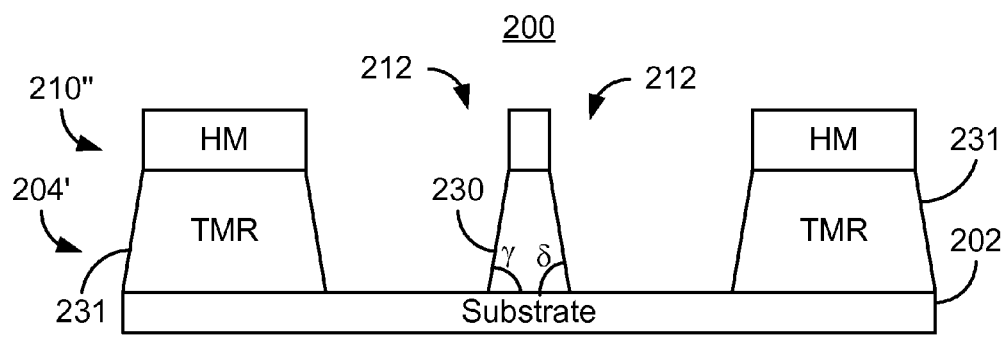

FIG. 13 depicts the transducer 200 after step 164 is performed. Thus, a magnetoresistive read sensor 230 has been defined. In some embodiments, portions 231 of the read sensor stack 204 distal from the sensor 230 are also defined from the read sensor stack 204. The junction angles γ and δ of the read sensor 230 are also shown. Due in part to the CJ FIBS polishing of step 164, the angles γ and δ are substantially the same.

An insulating layer is deposited on the read sensor, via step 166. In some embodiments, step 166 includes depositing a layer of aluminum oxide. The insulating layer is optionally provided if the magnetoresistive structure is to be used in a CPP configuration.

Hard bias layer(s) are deposited after the insulating layer is provided, via step 168. Thus, formation of the hard bias structures commences. A first portion of the hard bias material(s) is substantially adjacent to the magnetoresistive structure in the track width direction. In some embodiments, capping layer(s) for the hard bias material(s) is also provided in step 168. Such a capping layer may have sub-layer(s). For example, the capping layer may be a bilayer of Ta and Ru.

Figure 14:
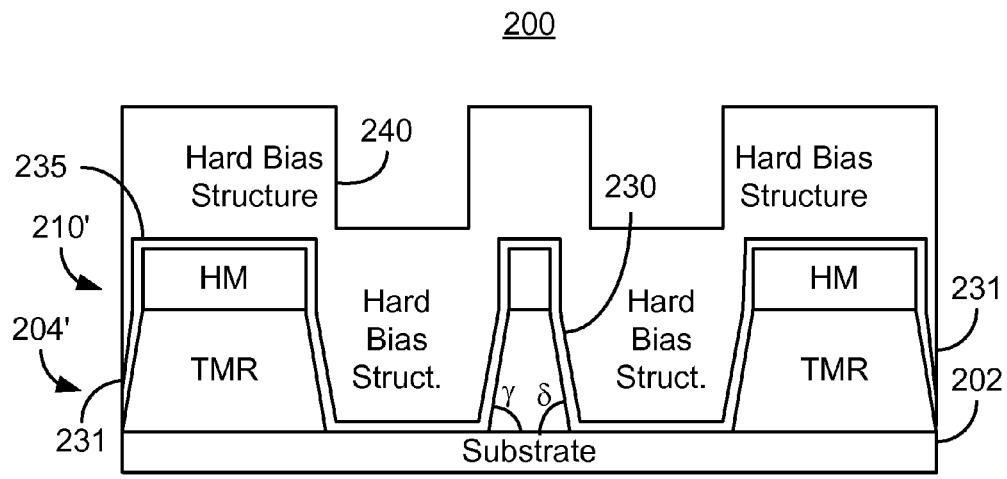

In another embodiment, the capping layer may be a trilayer including a first Ta sub-layer, a Ru sub-layer, and a second Ta sub-layer. In such an embodiment, the Ru sub-layer resides between the Ta sub-layers. FIG. 14 depicts the transducer 200 after step 168 is performed. Thus, optional insulating layer 235 and hard bias structure layer(s) 240 are shown. For simplicity, seed and/or capping layers for the hard bias structure 240, if any, are not separately shown.

Figure 15:
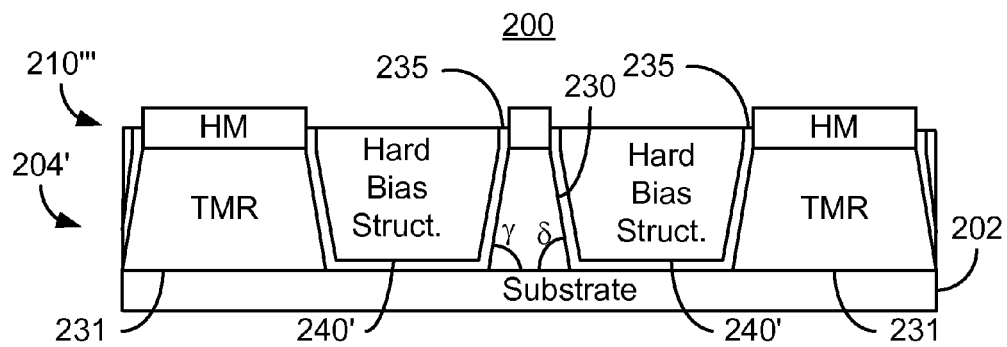

The hard bias layers are desired to be planarized. In some embodiments, this is performed via step 170. In some embodiments, a CMP may be performed. In other embodiments, another method for planarizing the transducer might be used. FIG. 15 depicts an ABS view of the transducer 200 after step 170 is performed. Thus, the mask 250 and a portion of the hard mask 210''' and hard bias 240' have been removed. Further, the variations in height of the hard bias 240'' and hard mask 210''' has been reduced.

Figure 16:
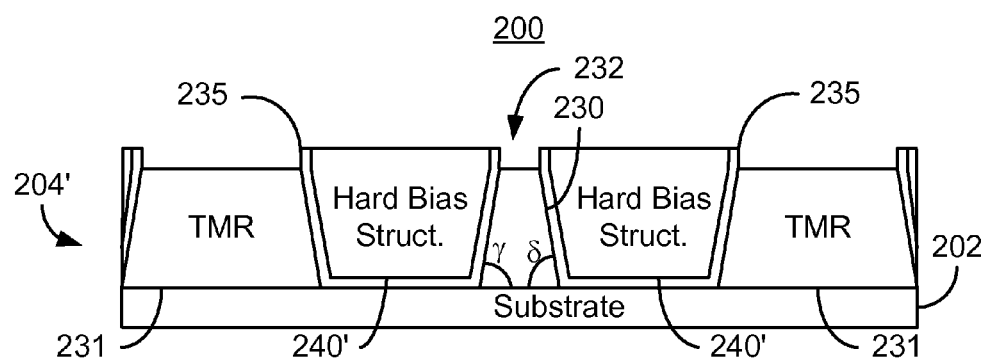

A remaining portion of the hard mask 210''' is removed after the planarization is performed, via step 172. In some embodiments, step 172 includes performing an SiC RIE to remove the hard mask 210'''. FIG. 16 depicts the transducer 200 after step 172 is performed. Thus, the magnetoresistive structure 230 has been exposed. A notch 232 exists between hard bias structures 240'.

Figure 17:
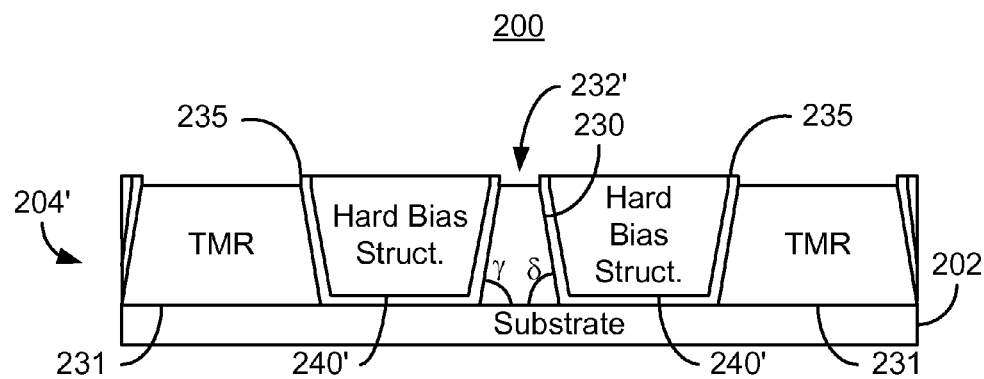

A notch FIBS polishing may be used to control the notch height, via step 174. Step 174 is analogous to the method 140. Thus, the heights of the notch 232 are measured. Scanning in connection with ion beam polishing that is based on the notch height is also performed. In general, more ion beam polishing is used to remove more of the hard bias structures 240', thereby reducing the height of the notch 232. FIG. 17 depicts an ABS view of the transducer 200 after step 174 is performed. Thus, the height of the notch 232" may be reduced and controlled.

Figure 18A:
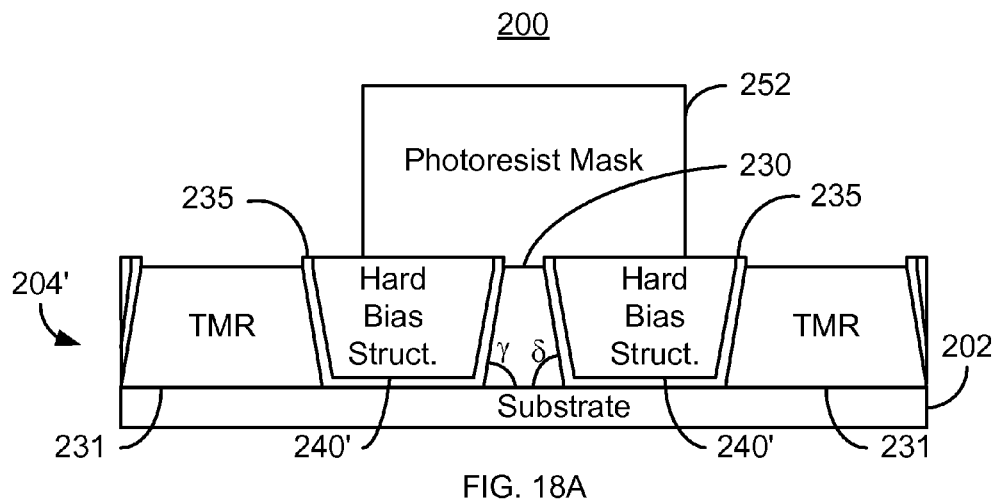
Figure 18B:
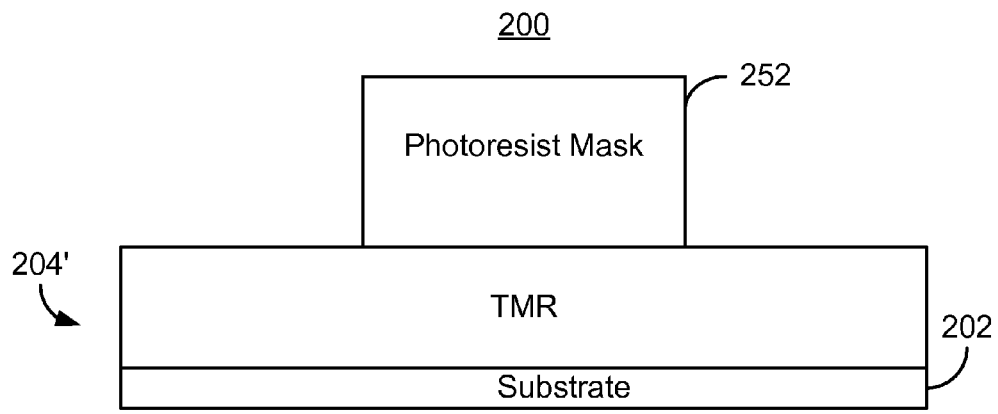

A stripe height mask is provided, via step 176. Step 176 is analogous to step 116. FIGS. 18A and 18B depict the transducer 200 from the ABS and apex, respectively, after step 176 is performed. The stripe height mask 252 is formed. In the embodiment shown, the stripe height mask 252 includes photoresist. However, in other embodiments, other materials might be used. The stripe height mask 252 covers a desired portion of at least the read sensor in a stripe height direction. In embodiments in which the read sensor is first defined in the track width direction, both the read sensor 230 being formed and part of the hard bias structure 240' are covered, as is shown in FIGS. 18A and 18B.

Figure 19A:
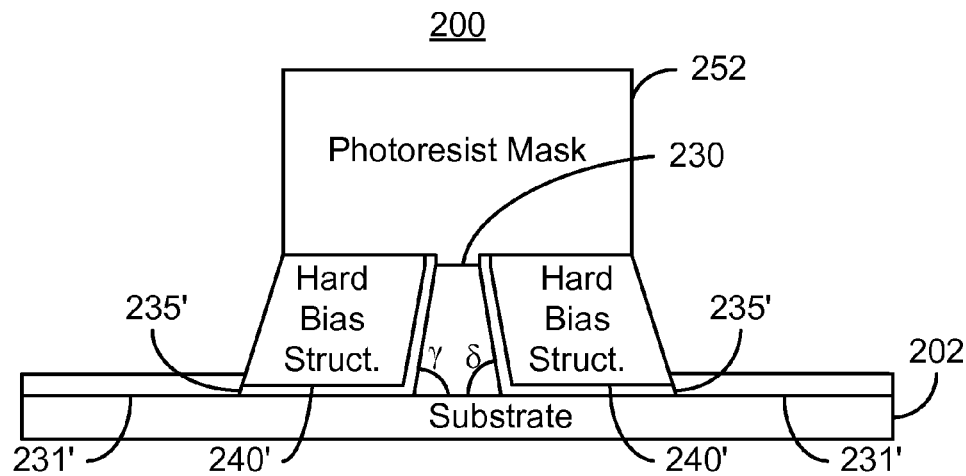
Figure 19B:
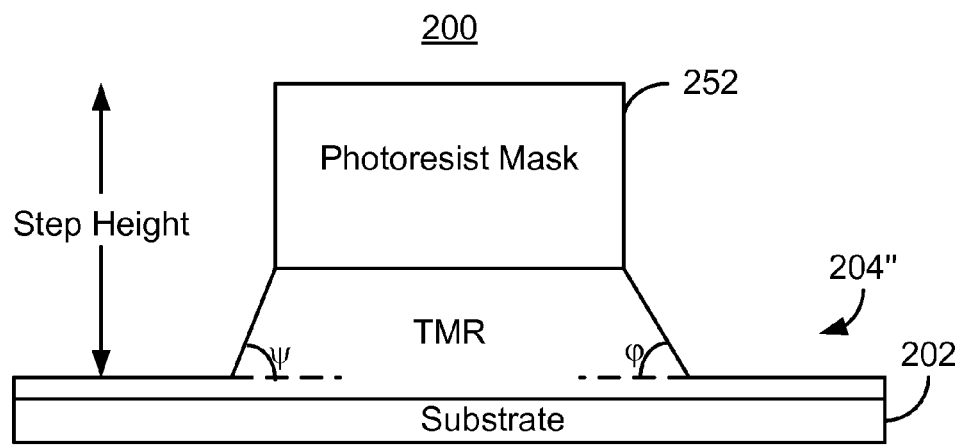

The stripe height of the read sensor is defined from the read sensor stack, via step 178. In some embodiments, step 178 is performed by an ion mill. Step 178 is analogous to step 118. Thus, portions of the read sensor further from the ABS than the stripe height and in the exposed field regions are removed. However, step 118 defines the read sensor in the stripe height direction perpendicular to the ABS, while step 106 defines the read sensor in the track width direction. FIGS. 19A and 19B depict ABS and apex views of the transducer 200 after step 178 is performed. Thus, a portion of the magnetoresistive structures 231 have been removed, while a portion 231' remains. Note that the portion 231' may also include some portion of the hard bias structure. Further, the apex view indicates that portions of the read sensor layer have been removed, leaving read sensor layer 204" having a step height and angles ψ and φ.

Figure 20A:
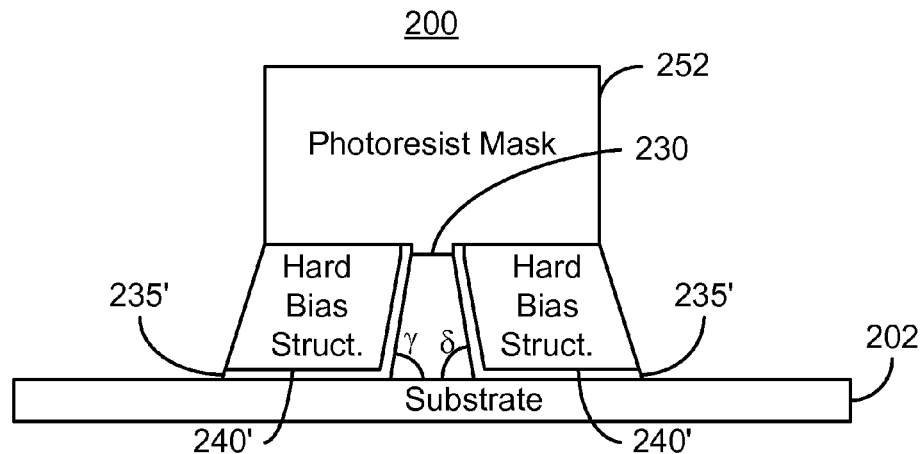
Figure 20B:
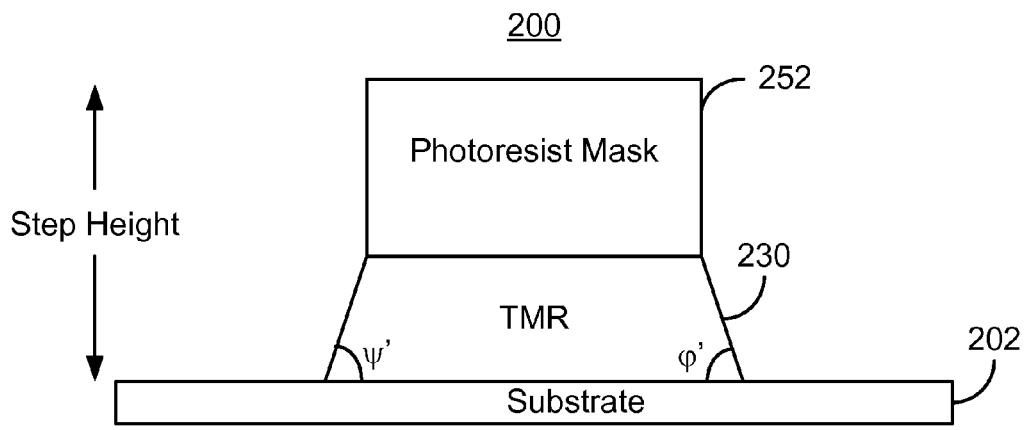

After step 178 is performed, some portion 231' of the read sensor stack 200 in the field regions may remain. Thus, a TMR FIBS polishing of the field region of the transducer is performed, via step 180. Step 180 is analogous to steps 120 and 108. Thus, the portions 231' of the read sensor stack 204 are measured to determine their step height and/or angles. Scanning and ion beam polishing are also performed to remove material based on the measurement. FIGS. 20A and 20B depict ABS and apex views, respectively, of the transducer 200 after step 180 is performed. Thus, the field regions of the transduce 200 have been cleaned. As a result, the step height has been increased. Also shown are angles φ' and ψ' in the apex region.

Figure 21A:
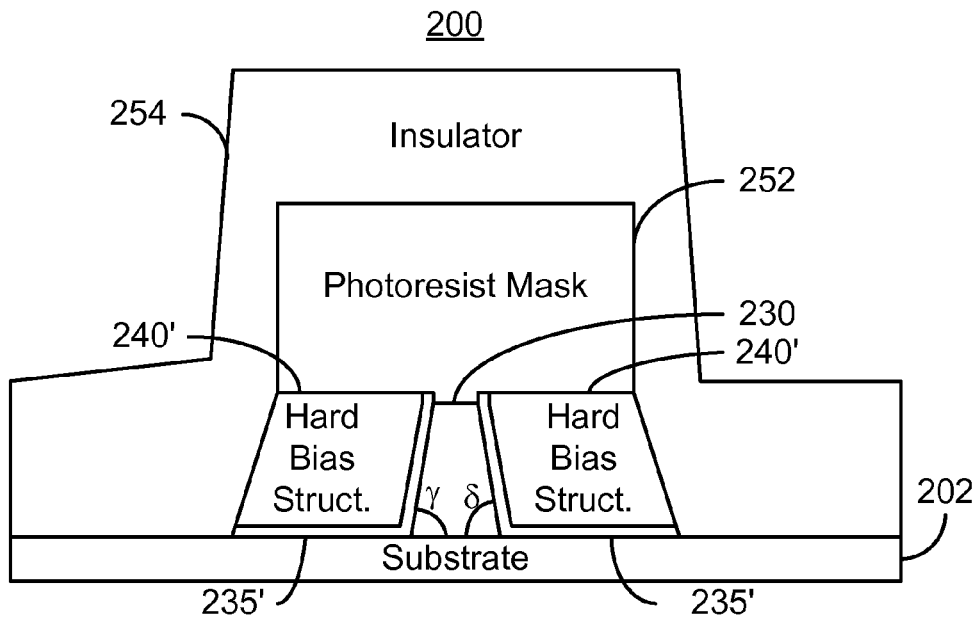
Figure 21B:
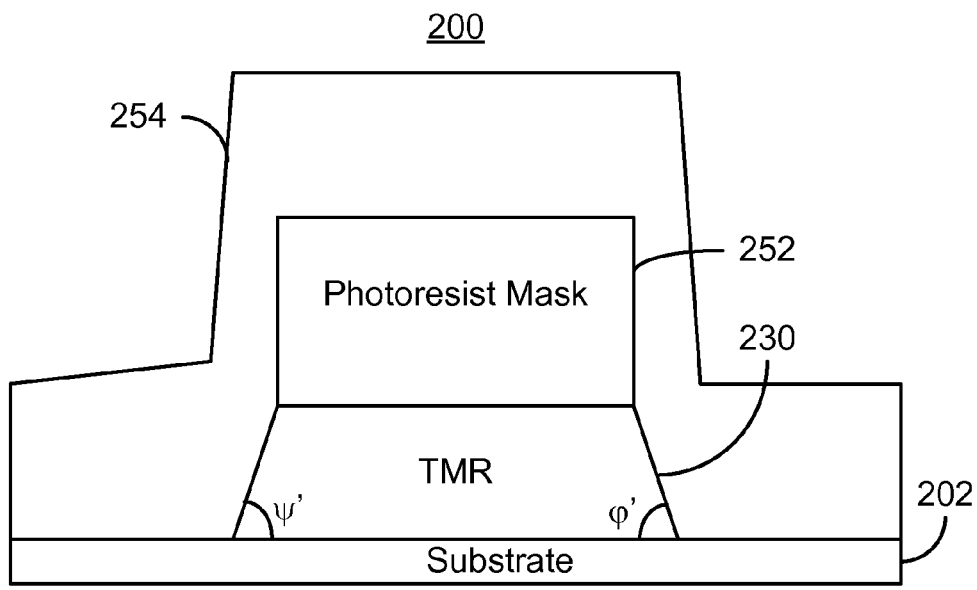

An insulating layer for electrically insulating the read transducer is provided, via step 182. More specifically, the hard bias structure and TMR sensor may be insulated. Step 182 may include masking the sensor 230 and depositing an insulating layer. FIGS. 21A and 21B depict ABS and apex views, respectively, of the transducer after step 182 is performed. Thus, an insulator 254 is shown.

Figure 22A:
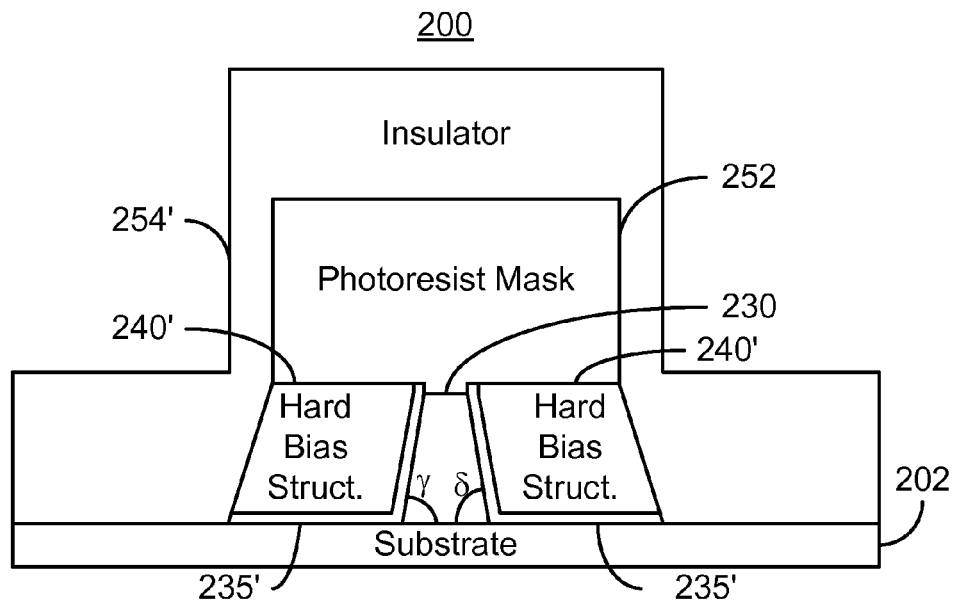
Figure 22B:
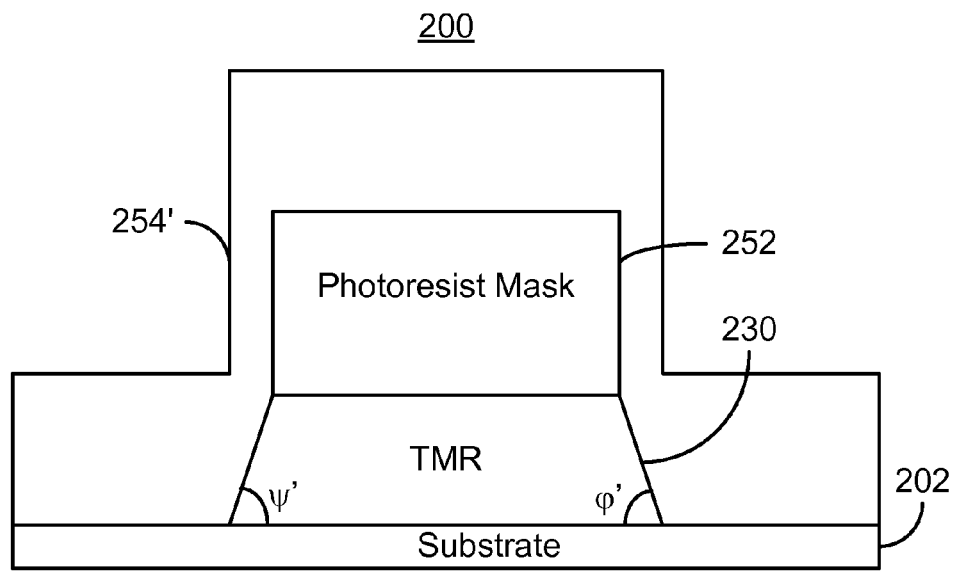

As can be seen in FIGS. 21A and 21B, the insulator 254 varies in thickness. Thus, a refill FIBS polishing is performed, via step 184. Step 184 is analogous to the method 140. Thus, the thicknesses of the insulator 254 are measured. Scanning in connection with ion beam polishing that is based on the thicknesses is also performed. More of the insulator 254 is removed from the thicker regions. FIGS. 22A and 22B depict ABS and apex views, respectively, of the transducer 200 after step 184 is performed. Thus, the variations in the thickness of the insulator 254' have been reduced.

Figure 23A:
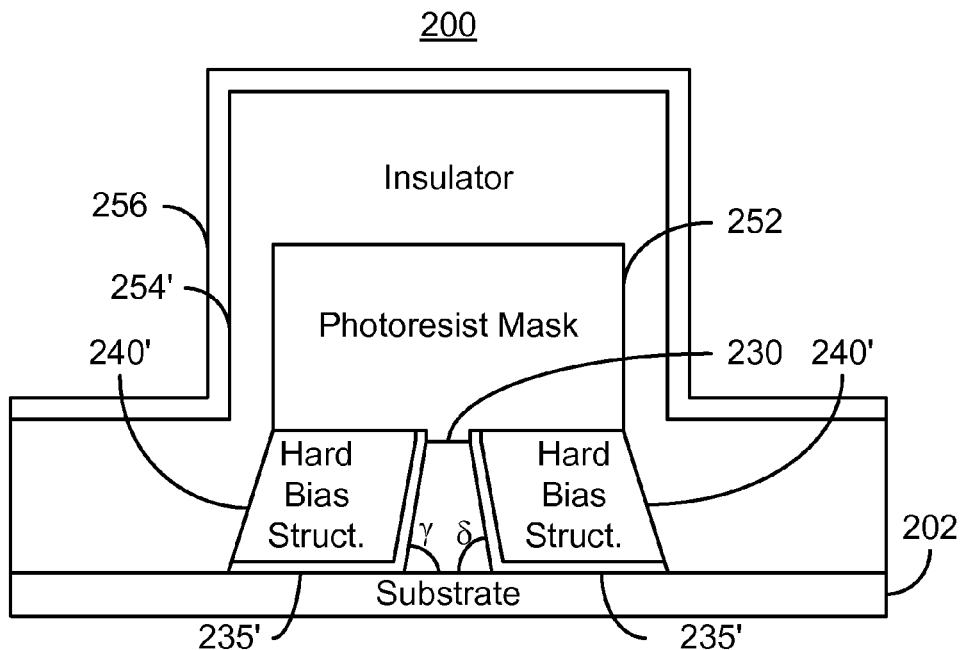
Figure 23B:
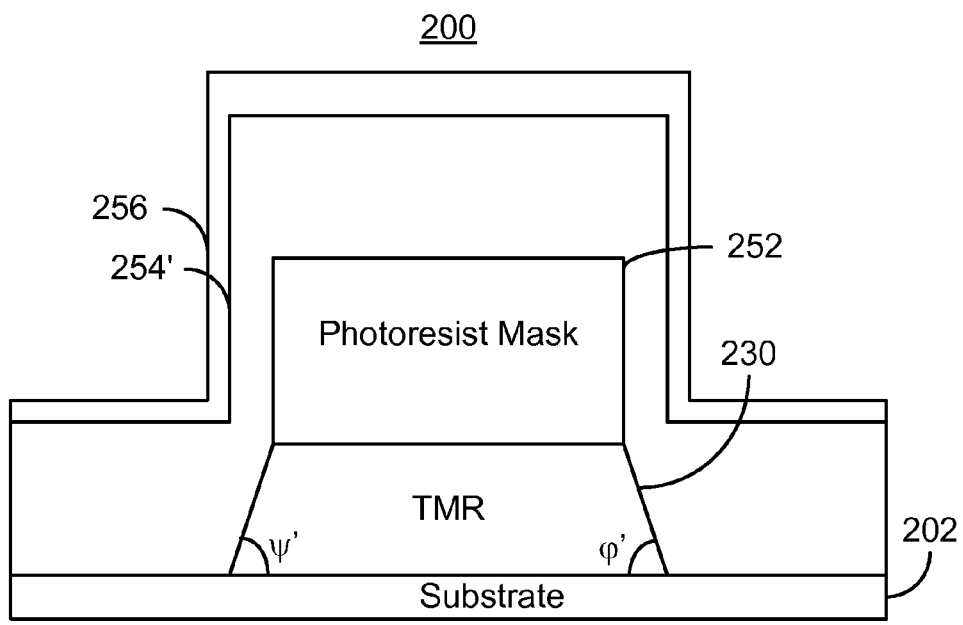

Fabrication of the transducer 200 is completed. A capping layer is deposited on the insulator 254', via step 186. FIGS. 23A and 23B depict ABS and apex views, respectively, of the transducer 200 after step 186 is performed. Capping layer 256 is thus shown.

Figure 24A:
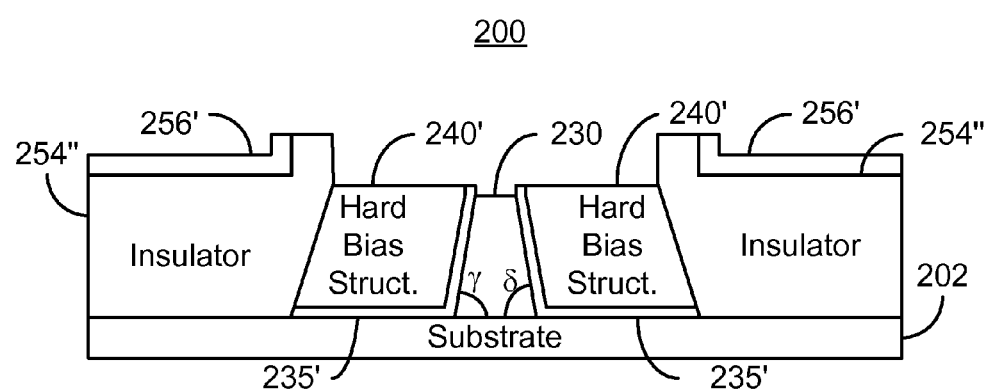
Figure 24B:
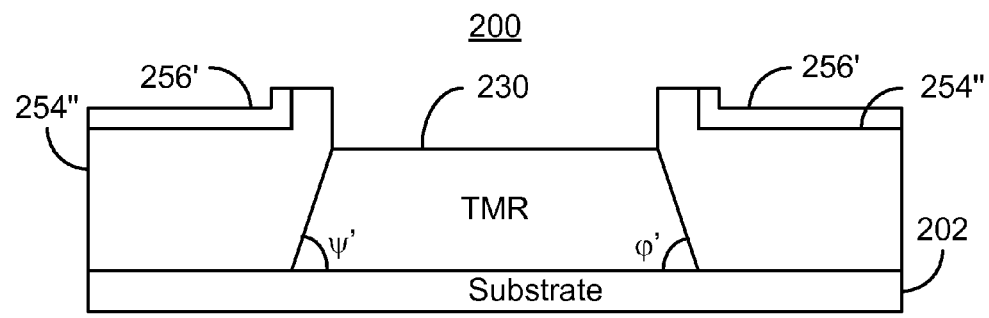

The stripe height mask 252 is removed, via step 188. Step 188 may include stripping the stripe height mask 252. FIGS. 24A and 24B depict ABS and apex views, respectively, of the transducer 200 after step 188 is performed. Thus, the stripe height mask 252 has been removed. The portion of the insulator 254 and capping layer 256 on this mask have also been removed. Consequently, the insulator 254" and capping layer 256' remain.

Figure 25A:
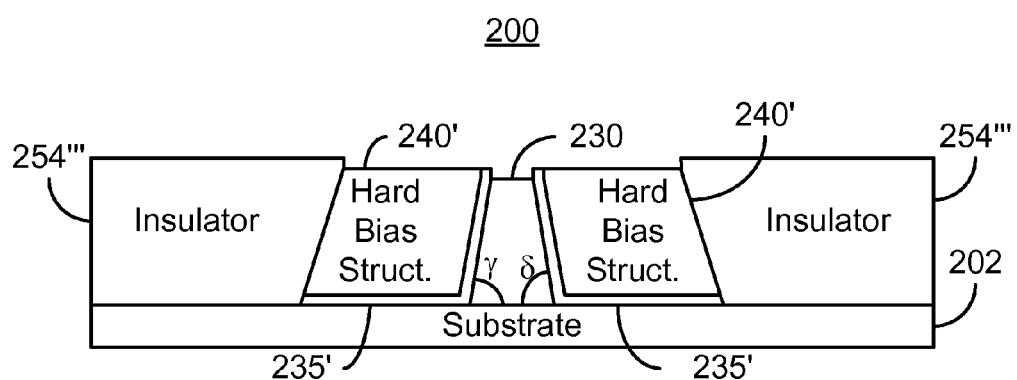
Figure 25B:
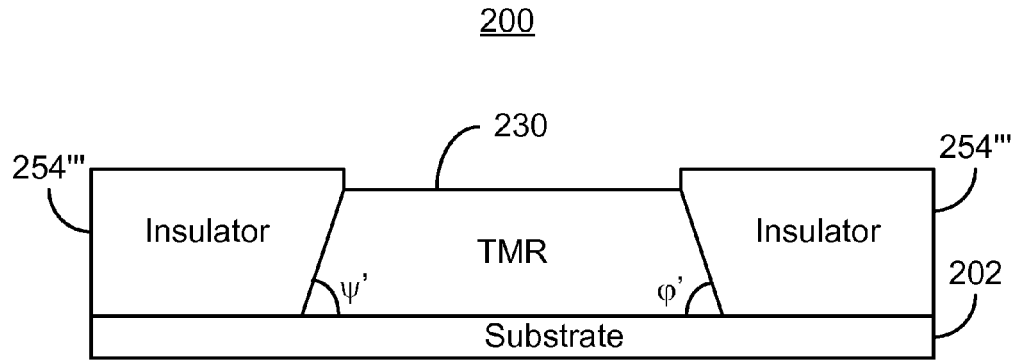

An additional planarization is performed, via step 190. Thus, the capping layer may be removed. FIGS. 25A and 25B depict ABS and apex views, respectively, of the transducer 200 after step 190 is performed. Thus, the insulator 254" remains.

Using the method 150, the transducer 200 having a magnetoresistive read sensor 230 may be formed. Fabrication of the transducer 200 may be improved. The FIBS polishing steps aid in reducing nonuniformities in fabrication of the transducer 200. Variations in the hard mask layer 210, the nonuniformity of the junction angles γ and δ, planarization of the hard bias structures 240, variations and magnitude of the height of the notch 232, removal of the read sensor stack from the field regions, and/or variations in thickness of the insulator 254 may be reduced. The geometry of the transducer 200 may thus be improved. Further, the transducer 200 may be less subject to subsequent damage. Performance of the transducer 200 and manufacturing using the method 200 may be enhanced.

We claim:

1. A method for fabricating a read sensor on a substrate for a read transducer, the read transducer having a field region and a device region in which the read sensor resides, the method comprising:

depositing a read sensor stack including a plurality of layers on the substrate;

providing a mask on the read sensor stack, the mask having a pattern, the pattern covering a first portion of the read sensor stack corresponding to the read sensor, covering a second portion of the read sensor stack distal from the read sensor, and exposing a third portion of the read sensor stack between the first portion and the second portion of the read sensor stack;

defining the read sensor from the read sensor stack in a track width direction, the defining the read sensor including substantially removing the third portion of the read sensor stack, the read sensor having an inboard junction angle and an outboard junction angle;

performing a critical junction (CJ) focused ion beam scan (FIBS) polishing of the transducer, the CJ FIBS polishing removing a portion of the read sensor based on the inboard junction angle and the outboard junction angle;

depositing a hard bias structure;

planarizing the transducer;

removing a remaining portion of the mask;

providing a stripe height mask covering a fourth portion of the read sensor and a portion of the hard bias structure in a stripe height direction;

defining a stripe height of the read sensor from the read sensor stack;

performing a tunneling magnetoresistance (TMR) FIBS polishing of the field region of the transducer, the TMR FIBS polishing removing a remaining portion of the read sensor stack in the field region; and providing an insulating layer for electrically insulating the read transducer.

2. The method of claim 1 wherein the step of performing the CJ FIBS polishing further includes:

measuring the inboard junction angle and the outboard junction angle; and scanning across the substrate while ion polishing such that the ion polishing removes a greater amount of read sensor for a smaller angle of the inboard junction angle and the outboard junction angle.

3. The method of claim 2 wherein the step of scanning further includes:

making multiple passes across at least a portion of the substrate.

4. The method of claim 2 wherein the step of scanning further includes:

performing the ion polishing for a longer time for the smaller angle of the inboard junction angle and the outboard junction angle.

5. The method of claim 1 wherein the step of performing the TMR FIBS polishing further includes:

measuring at least one of a step height and an angle for a remaining portion of the read sensor stack in the field region; and scanning across at least the field region the substrate while ion polishing such that the ion polishing removes a greater amount of the remaining portion of the read sensor stack for at least one of a smaller step height and a smaller angle.

6. The method of claim 5 wherein the step of scanning further includes:

making multiple passes across the at least the field region.

7. The method of claim 5 wherein the step of scanning further includes:

performing the ion polishing for a longer time for the smaller step height and the smaller angle.

8. The method of claim 1 wherein the step of providing the mask further includes:

depositing a hard mask layer having a plurality of hard mask layer thickness;

performing a hard mask FIBS polishing on the hard mask layer such that a greater amount of hard mask layer is removed for a greater hard mask layer thickness of the plurality of hard mask layer thickness;

providing a photoresist mask having a photoresist mask pattern on the hard mask layer; and transferring the photoresist mask pattern to the hard mask layer, forming a hard mask having the pattern.

9. The method of claim 1 wherein a remaining portion of the hard bias structure has a notch corresponding to the read sensor therein after the step of removing the remaining portion of the mask, the notch having a height, the method further comprising:

performing a notch FIBS polishing of the hard bias structure after the step of removing the remaining portion of the mask, the notch FIBS polishing removing a portion of the hard bias structure to reduce the height of the notch, the step of performing the notch FIBS polishing further including measuring at least a plurality of notch heights across the substrate;

scanning across the substrate while ion polishing such that a greater amount of the hard bias structure is removed for the greater notch height of the plurality of notch heights.

10. The method of claim 1 wherein the insulating layer has a plurality of insulating layer thicknesses, the method further comprising:

performing a refill FIBS polishing of the insulating layer, the refill FIBS polishing removing a portion of the insulating layer based on the plurality of insulating layer thicknesses.

11. The method of claim 10 the step of performing the refill FIBS polishing further including measuring at least a plurality of insulating layer thicknesses across the substrate;

scanning across the substrate while ion polishing such that a greater amount of the insulating layer is removed for the greater insulating layer thickness of the plurality of insulating layer thicknesses.

12. A method for fabricating a read sensor on a substrate for a read transducer, the read transducer having a field region and a device region in which the read sensor resides, the method comprising:

depositing a read sensor stack including a plurality of layers on the substrate;

depositing a hard mask layer on the read sensor stack, the hard mask layer having a plurality of hard mask layer thicknesses;

performing a hard mask focused ion beam scan (FIBS) polishing on the hard mask layer such that a greater amount of hard mask layer is removed for a greater hard mask layer thickness of the plurality of hard mask layer thickness;

providing a photoresist mask having a photoresist mask pattern on the hard mask layer; and transferring the photoresist mask pattern to the hard mask layer, forming a hard mask having a pattern, the pattern covering a first portion of the read sensor stack corresponding to the read sensor, covering a second portion of the read sensor stack distal from the read sensor, and exposing a third portion of the read sensor stack between the first portion and the second portion of the read sensor stack;

defining the read sensor in a track width direction from the read sensor stack, the defining the read sensor including substantially removing the third portion of the read sensor stack, the read sensor having an inboard junction angle and an outboard junction angle;

performing a critical junction (CJ) FIBS polishing of the transducer, the step of performing the CJ FIBS polishing including measuring the inboard junction angle and the outboard junction angle; and scanning across the substrate while ion polishing such that the ion polishing removes a greater amount of read sensor for a smaller of the inboard junction angle and the outboard junction angle;

depositing an insulting layer on the read sensor;

depositing a hard bias structure after the step of depositing the insulating layer the hard bias structure including a magnetic layer and a capping layer;

planarizing the transducer;

removing a remaining portion of the hard mask, a top surface of the read sensor being exposed, a remaining portion of the hard bias structure having a notch corresponding to the read sensor therein, the notch having a notch height;

performing a notch FIBS polishing of the hard bias structure after the step of removing the remaining portion of the mask, the polishing FIBS polishing removing a portion of the hard bias structure to reduce the height of the notch, the step of performing the notch FIBS polishing further including measuring at least a plurality of notch heights across the substrate;

scanning across the substrate while ion polishing such that a greater amount of the hard bias structure is removed for the greater notch height of the plurality of notch heights;

providing a stripe height mask covering a fourth portion of the read sensor and a portion of the hard bias structure in a stripe height direction;

defining a stripe height of the read sensor;

performing a TMR FIBS polishing of the field region of the transducer, the TMR FIBS polishing removing a remaining portion of the read sensor stack in the field region;

providing an insulating layer for electrically insulating the read transducer, the insulating layer having a plurality of insulating layer thicknesses;

performing a refill FIBS polishing of the insulating layer, the refill FIBS polishing removing a portion of the insulating layer based on the plurality of insulating layer thicknesses;

depositing a capping layer;

removing the stripe height mask; and performing an additional planarization.

13. A method for fabricating a read sensor on a substrate for a read transducer, the read transducer having a field region and a device region in which the read sensor resides, the method comprising:

depositing a read sensor stack including a plurality of layers on the substrate;

providing a stripe height mask covering a first portion of the read sensor stack in a stripe height direction;

defining a stripe height of the read sensor from the read sensor stack;

performing a tunneling magnetoresistance (TMR) focused ion beam scan (FIBS) polishing of the field region of the transducer, the TMR FIBS polishing removing a remaining portion of the read sensor stack in the field region;

providing an insulating layer that electrically insulates the read transducer;

removing the stripe height mask;

performing a planarization;

providing a mask on the on the read sensor stack, the mask having a pattern, the pattern covering a second portion of the read sensor stack corresponding to the read sensor, covering a third portion of the read sensor stack distal from the read sensor, and exposing a fourth portion of the read sensor stack between the second portion and the third portion of the read sensor stack;

defining the read sensor from the read sensor stack in a track width direction, the defining the read sensor including substantially removing the fourth portion of the read sensor stack, the read sensor having an inboard junction angle and an outboard junction angle for the read sensor track width;

performing a critical junction (CJ) FIBS polishing of the transducer, the CJ FIBS polishing removing a portion of the read sensor based on the inboard junction angle and the outboard junction angle;

depositing a hard bias structure;

planarizing the transducer;

removing a remaining portion of the mask.

\* \* \* \* \*